(12) United States Patent
Moss et al.

(10) Patent No.: US 6,650,535 B1
(45) Date of Patent: Nov. 18, 2003

(54) FANLESS POWER SUPPLY

(75) Inventors: David L. Moss, Austin, TX (US); Robert G. Bassman, Austin, TX (US)

(73) Assignee: Dell Products L.P., Round Rock, TX (US)

(*) Notice: Subject to any disclaimer, the term of this patent is extended or adjusted under 35 U.S.C. 154(b) by 0 days.

(21) Appl. No.: 09/360,467

(22) Filed: Jul. 23, 1999

(51) Int. Cl.⁷ .................................................. G06F 1/16
(52) U.S. Cl. .................. 361/687; 361/695; 454/184; 312/223.1
(58) Field of Search ................ 361/683, 687, 361/686, 689, 692, 695, 690, 694; 312/223.1, 223.2; 364/708.1; 174/16.1; 220/4.02, 4.28; 248/632; 218/105, 106, 109; 307/50; G06F 1/16

(56) References Cited

U.S. PATENT DOCUMENTS

| | | | |
|---|---|---|---|
| 4,126,269 A | * 11/1978 | Bruges ........................ 236/49 |
| 4,728,160 A | * 3/1988 | Mondor et al. ............. 312/236 |
| 4,982,120 A | 1/1991 | Longwell et al. ........... 307/572 |
| 5,099,391 A | * 3/1992 | Maggelet et al. ........... 361/395 |
| 5,119,270 A | * 6/1992 | Bolton et al. ............... 361/384 |
| 5,168,424 A | * 12/1992 | Bolton et al. ............... 361/384 |
| 5,193,050 A | * 3/1993 | Dimmick et al. ........... 361/384 |
| 5,218,514 A | * 6/1993 | Huynh et al. ............... 361/384 |
| 5,237,484 A | * 8/1993 | Ferchau et al. ............. 361/689 |
| 5,243,493 A | 9/1993 | Jeng et al. ................... 361/690 |
| 5,408,669 A | 4/1995 | Stewart et al. .............. 395/750 |
| 5,530,636 A | 6/1996 | Brown ........................ 363/97 |
| 5,596,483 A | * 1/1997 | Wyler ......................... 361/683 |
| 5,715,465 A | 2/1998 | Savage et al. .............. 395/750 |
| 5,737,189 A | * 4/1998 | Kammersgard et al. .... 361/726 |
| 5,793,610 A | * 8/1998 | Schmitt et al. ............. 361/695 |
| 5,898,572 A | 4/1999 | Shennib et al. ............. 361/713 |
| 5,909,357 A | * 6/1999 | Orr ............................. 361/687 |
| 5,940,288 A | * 8/1999 | Kociecki .................... 363/144 |
| 6,011,689 A | * 1/2000 | Wrycraft .................... 361/695 |
| 6,115,250 A | * 9/2000 | Schmitt ...................... 361/695 |

OTHER PUBLICATIONS

Article "Thermally Optimized System Layout for Computers", IBM Technical Disclosure Bulletin. Mar. 1991, US, vol. 33, Issue 10A, pp. 51–53.*

(List continued on next page.)

Primary Examiner—Michael Datskovsky
(74) Attorney, Agent, or Firm—Baker Botts L.L.P.

(57) ABSTRACT

A method and system for use with data processing systems. The method includes forming a fanless power supply having at least one air ingress and at least one air egress. The method further includes forming a fanless power supply receptacle having at least one air ingress and at least one air egress. The system includes forming a fanless power supply having at least one air ingress and at least one air egress. The system further includes forming a fanless power supply receptacle having at least one air ingress and at least one air egress.

40 Claims, 5 Drawing Sheets

OTHER PUBLICATIONS

An Article: "Forced Convection, Downward Flow Cooling System" IBM Technical Disclosure Bulletin, Oct. 1998, vol. 31, Issue 5, pp. 44–47.*

An Article: "Personal Computer Structure Designed for Robotized Manufacturability" IBM Technical Disclosure Bulletin, Aug. 1987, vol. 30, Issue 3, pp. 1253–1255.*

An Article: "Ventilation System for Data Proceesing Systems" IBM Technical Disclosure Bulletin, Feb. 1975, vol. 17, Issue 9, pp. 2529–2530.*

Jerry D. Gandre, Steven L. Sands, R. Steven Mills, and Arthur Lopez; "Power Supply Scheme Allowing Same Power Supply Module For Non–Redundant And Redundant Versions"; Oct. 16, 1997; Ser. No.: 08/951,798; 21 pages; and 10 pages of formal drawings. (Copy Not Enclosed).

Sean P. O'Neal and Reynold Liao; "AC Voltage Adapter With Integrated DC Voltage Power Supply Connector"; Mar. 26, 1999; Ser. No.: 09/277/863; 20 pages; and 2 pages of formal drawings. (Copy Not Enclosed).

Andrew L. McAnally, R. Steven Mills, and Eric Holloway; "Computer Power Supply Insertion And Extraction Apparatus And Method"; Oct. 24, 1997; Ser. No.: 08/957,433; 17 pages; and 8 pages of formal drawings. (Copy Not Enclosed).

Dell Computer Corporation; "Dell® Poweredge® 4350 Systems: Installation And Troubleshooting Guide"; Sep. 1998.

Dell Computer Corporation; "Dell ® Poweredge® 4350 Systems: User's Guide"; Sep. 1998.

* cited by examiner

FANLESS POWER SUPPLY

BACKGROUND OF THE INVENTION

1. Field of the Invention

The present invention relates, in general, to a method and system to be utilized in data processing systems.

2. Description of the Related Art

Data processing systems are systems that manipulate, process, and store data and are notorious within the art. Personal computer systems, and their associated subsystems, constitute one well known species of data processing systems. Network server computer systems, and their associated subsystems, constitute another well known species of data processing systems.

A personal computer system may be a desktop model system which can include one or more of the following microprocessors, fans, magnetic disk drives, CD-ROM disk drives, keyboards, printer devices, monitors, modems, digital cameras, fax machines, network cards, and various associated data buses to support the foregoing noted devices, as well as the supporting software to allow the foregoing devices to work together to provide a complete standalone system; furthermore, various other devices can also be utilized in order to provide the complete standalone system.

A network server computer system can include some or all of the foregoing noted components listed for the desktop model system, plus other additional hardware or software, such as that necessary to control one or more network switches. In addition, a network server computer system is commonly employed in a rack-mounted system. A rack is a frame in which one or more pieces of equipment are mounted, typically in a stacked (i.e., one atop another) configuration. Typically, rack-mounted network server computer systems are manufactured to fit within industry-standard "racks," defined in terms of industry standard "Rack Units" (an industry-standard unit defined to be 1¾ " height of rack space). For example, a 7U network server computer system is manufactured such that it will fit within a "7U" space (e.g., a height of 12.25"). A 4U network server computer system is manufactured such that it will fit within a "4U" space (e.g., a height of 7"). If a network server computer system is built, its height cannot exceed its rack unit height specification. Consequently, network server components and capabilities are often supplied via increased depth of network server computers.

Each of the foregoing-referenced active data processing system (e.g., personal computer systems or network server computer systems) components consumes power and produces waste heat in the process of performing its functions. Both power consumption and waste heat management within data processing systems have become a concern in the data processing art. One reason for this is that electric power must be paid for, so power consumption translates to cost. Another reason is that many data processing components (e.g., modem processors) are only guaranteed to function appropriately to a particular case temperature. Thus, it is imperative to remove the excess heat from the system, since if the heat is not removed, it can build up and either cause system inaccuracies or actually result in damage to data processing system components.

In order to dissipate heat from data processing systems, multiple exhaust fans are often utilized. However, one problem arising from the use of such fans is that they themselves draw power and produce waste heat in the course of performing their functions. The foregoing problems, which are significant in personal computer systems, are actually exacerbated in network server computer systems. As noted, network server computer systems often contain their components in enclosures of relatively limited height and relatively significant depth. Furthermore, network server computer systems are often stacked in racks. Thus, thermal management becomes even more of a problem due to the fact that the depth-wise arrangement of the network server computer system components means that cooling air must be brought from the front or the back of the network computer systems (the top and the bottom of the units being blocked by other rack-mounted equipment). Furthermore, as the height of the rack mounted units shrinks (e.g., from 7U to 4U), more power is generated in a smaller volume enclosures, which exacerbates the already serious problems associated with dissipating heat in data processing systems. In addition to the foregoing, there is a move within the art to pack even more network server computer system components into each network server computer system. Thus, in network server computer systems thermal management is currently a problem and is likely to become more of a problem in the future as enclosure volumes shrink.

In addition to the foregoing, those skilled in the art will recognize that it is also desired to enclose more personal computing system components in smaller volume enclosures. Enclosing data processing system components in smaller enclosures makes thermal management even more of a problem due to the proximity of the system components. Furthermore, there is a move within the art to pack even more personal computer system components into each personal computer system. Thus, in personal computer systems thermal management is currently a problem, and is likely to become more of a problem in the future as enclosure volumes shrink.

It is therefore apparent that a need exists in the art for a method and system which will provide heat dissipation in data processing systems in such a way that neither produces additional heat nor takes up excessive space in the data processing systems.

SUMMARY OF THE INVENTION

It has been discovered that a system and method can be produced which will, among other things, provide heat dissipation in data processing systems in such a way that neither produces additional heat nor takes up excessive space in the data processing systems. The method includes forming a fanless power supply having at least one air ingress and at least one air egress. The method further includes forming a fanless power supply receptacle having at least one air ingress and at least one air egress. The system includes a fanless power supply having at least one air ingress and at least one air egress. The system further includes a fanless power supply receptacle having at least one air ingress and at least one air egress.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

The following sets forth a detailed description of the best contemplated mode for carrying out the multiple independent inventions described herein. The description is intended to be illustrative and should not be taken to be limiting. In addition to the following description, incorporated by reference in their entireties are the Dell PowerEdge 4350 Systems Users Guide (September 1998), available from Dell Computer Corporation, One Dell Way, Round Rock, Tex., 78682-2244 and the Dell PowerEdge 4350 Systems Installation and Troubleshooting Guide (September 1998) likewise available from Dell Computer Corporation, One Dell Way, Round Rock, Tex., 78682-2244.

Figure 1:
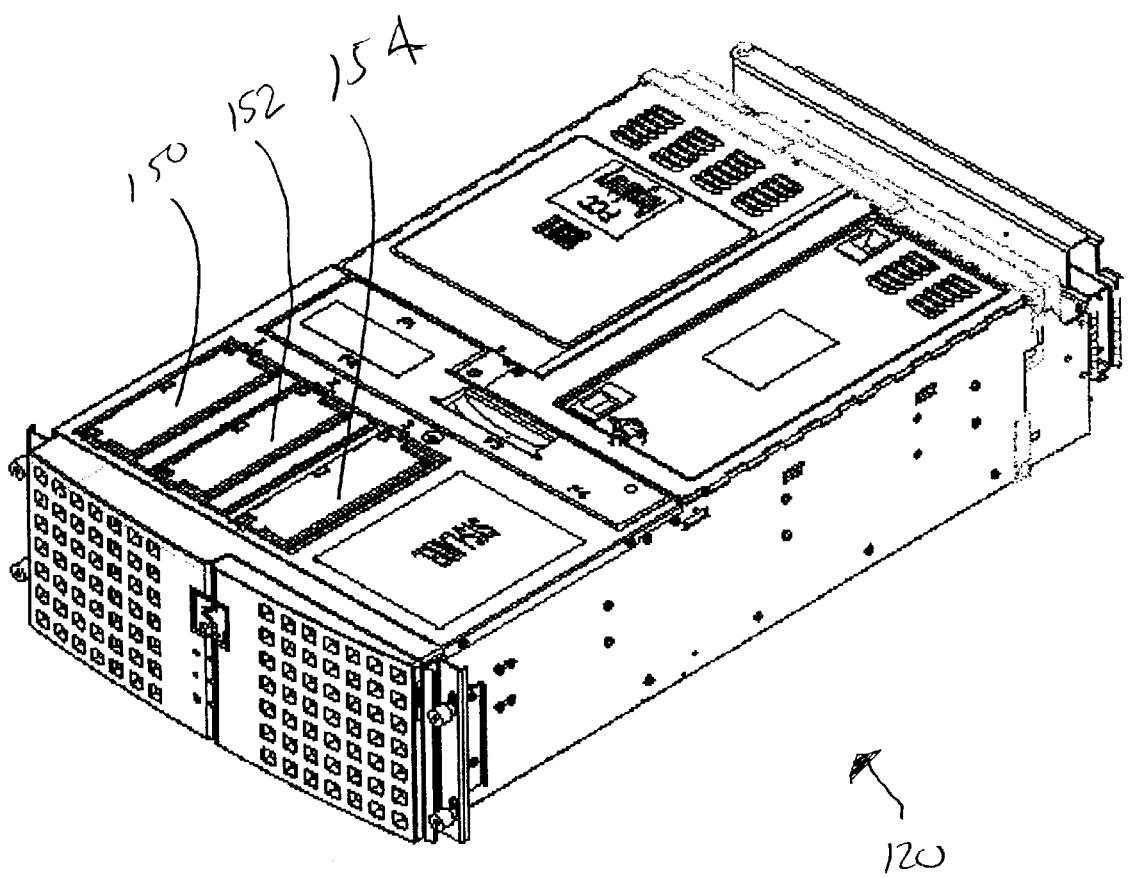
FIG. 1 depicts a pictorial representation of a data-processing system in which three fanless power supplies 150–154 are shown.

With reference now to the figures and in particular with reference now to FIG. 1, there is depicted a pictorial representation of a data-processing system in which three fanless power supplies 150–154 (discussed in more detail below) are shown. A network server computer 120 is depicted. Not shown, for sake of clarity, but understood to be present and associated with network server computer 120 are a video display, keyboard, mouse, and other optional input-output devices utilized to control and interact with network server computer 120. Network computer system 120 may be implemented utilizing any suitable network server computer such as Dell PowerEdge model 4350 or model 6350 network servers.

Fanless power supplies 150–154 do not have fans, and thus avoid the bulk associated with power supply fans. Furthermore, those skilled in the art will recognize that existing power supplies having fans typically must be completely replaced if the power supply fan fails. Fanless power supplies 150–154 avoid such failures associated with power supply fans.

Figure 2:
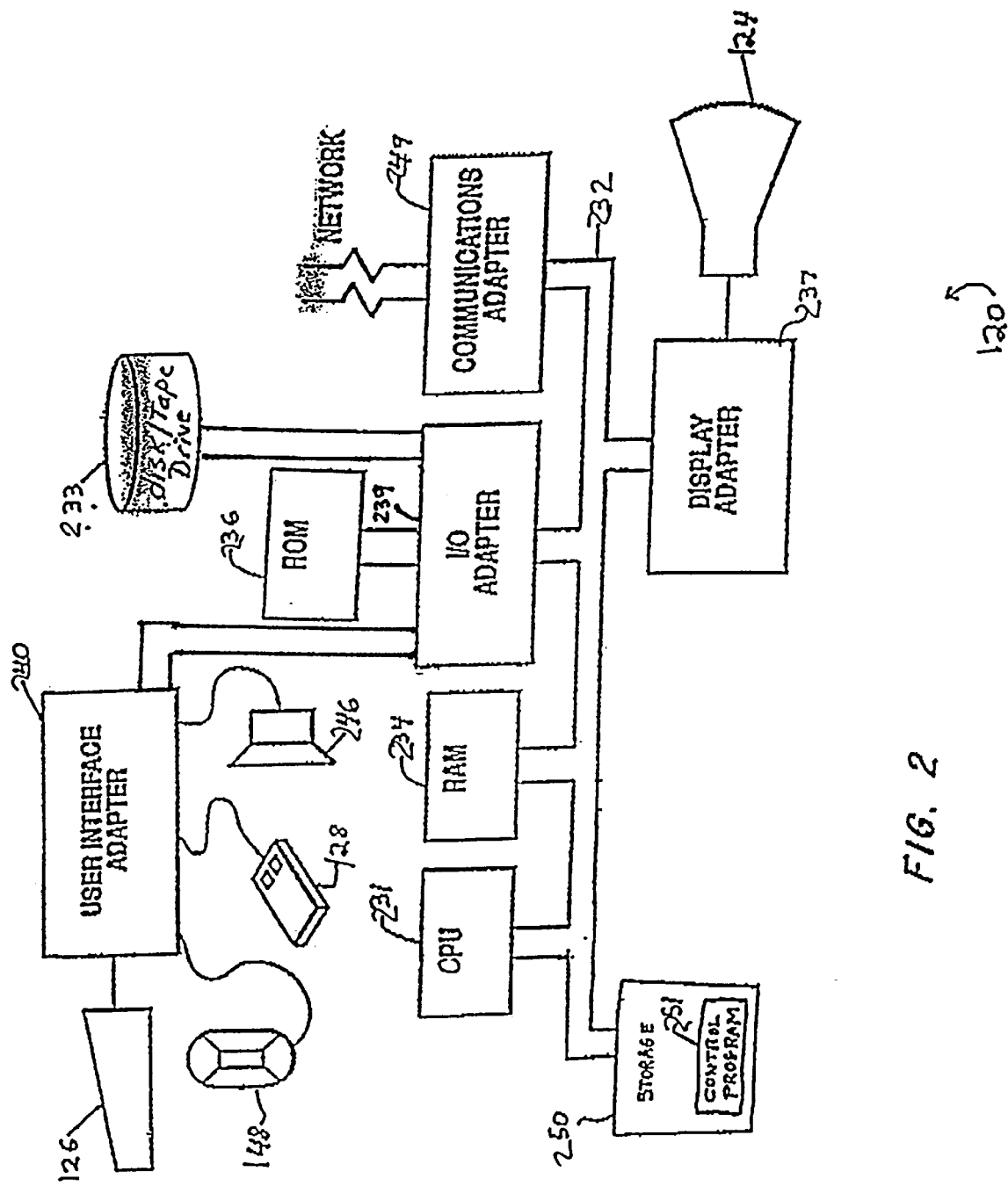
FIG. 2 illustrates a representative hardware environment, which can be utilized in accordance with the method and system of an illustrative embodiment of the present invention.

Referring now to FIG. 2, depicted are selected components in network server computer 120. Network server computer 120 includes a Central Processing Unit ("CPU") 231, which is intended to be representative of either a conventional microprocessor, or more modern multiprocessors, and a number of other units interconnected via system bus 232. Network server computer 120 includes random-access memory ("RAM") 234, read-only memory ("ROM") 236, display adapter 237 for connecting system bus 232 to video display device 124, and I/O adapter 239 for connecting peripheral devices (e.g., disk and tape drives 233) to system bus 232. Video display device 124 is the visual output of computer 120, which can be a CRT-based video display well-known in the art of computer hardware. However, video display device 124 can also be an LCD-based or a gas plasma-based flat-panel display. Network server computer 120 further includes user interface adapter 240 for connecting keyboard 126, mouse 128, speaker 246, microphone 148, digital camera and/or other user interface devices (not shown), such as a touch screen device (not shown), to system bus 232 through I/O adapter 239. Communications adapter 249 connects network server computer 120 to a data-processing network.

Any suitable machine-readable media may retain the graphical user interface, such as RAM 234, ROM 236, a magnetic diskette, magnetic tape, or optical disk (the last three being located in disk and tape drives 233). Any suitable operating system and/or associated graphical user interface (e.g., Microsoft Windows) may direct. CPU 231. Other technologies can also be utilized in conjunction with CPU 231, such as touch-screen technology or human voice control. In addition, network server computer 120 includes a control program 251 which resides within computer storage 250.

Those skilled in the art will appreciate that the hardware depicted in FIG. 2 may vary for specific applications. For example, other peripheral devices such as optical disk media, audio adapters, or programmable devices, such as PAL or EPROM programming devices well-known in the art of computer hardware, and the like may be utilized in addition to or in place of the hardware already depicted.

Those skilled in the art will recognize that network server computer 120 can be described in relation to other network server computers which perform essentially the same functionalities, irrespective of architectures.

It has been discovered that a method and system can be produced which will, among other things, provide for heat dissipation in network server computers in such a way that neither additional heat is produced within nor excessive space is taken up in the network server computer. The method and system described herein proves to be particularly useful in network server computer systems, such as network server computer 120.

Figure 3:
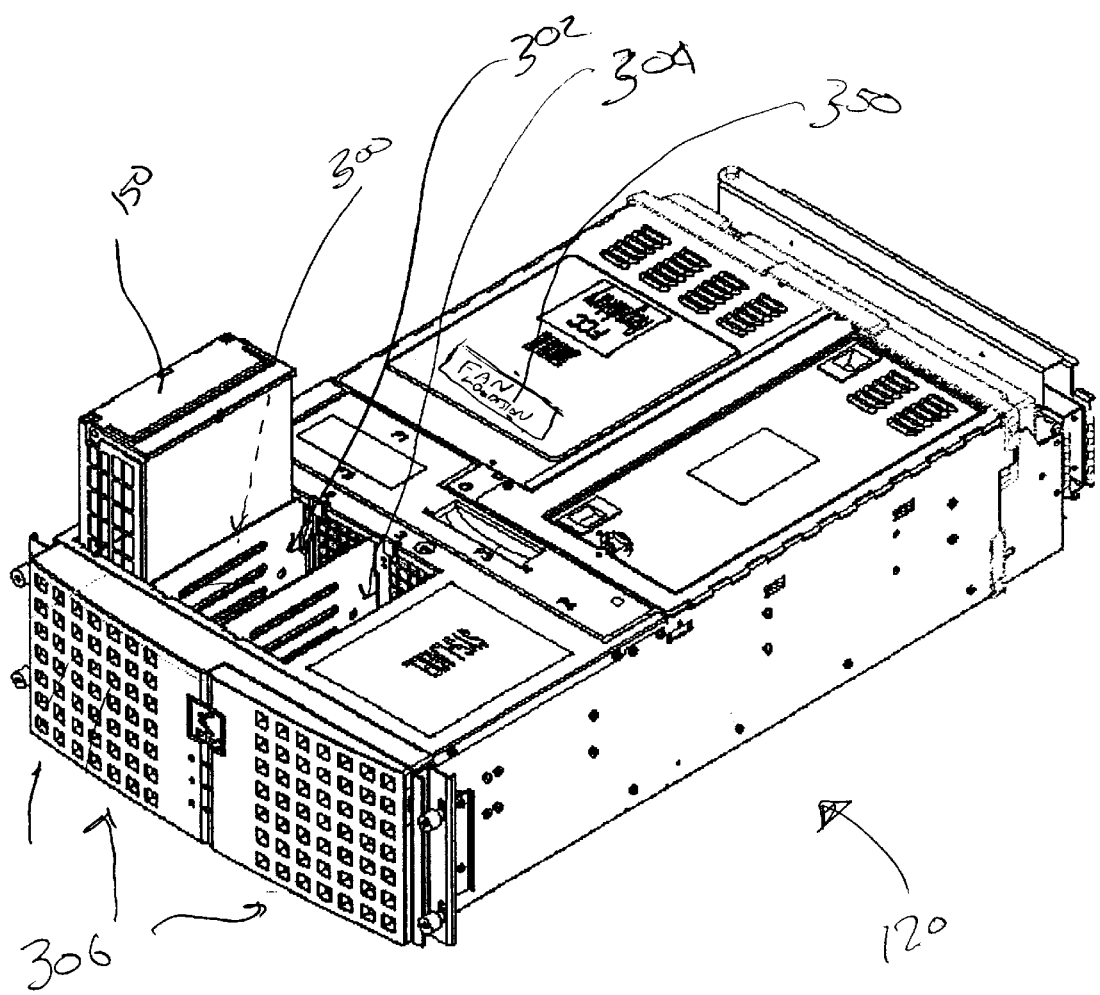
FIG. 3 shows a perspective view of fanless power supply 150 being extracted from network server computer 120.

Referring now to FIG. 3, shown is a perspective view of fanless power supply 150 being extracted from network server computer 120. Depicted are fanless power supply receptacles 300, 302, 304. Illustrated is that fanless power supply 150 is extracted from fanless power supply receptacle 300, while fanless power supply receptacles 302, 304 are empty. Fanless power supply receptacles 300, 302, 304 have blind mate connections (not shown) which mate with blind mate connections (not shown) on the underside of fanless power supplies, such as fanless power supply 150. Depicted are air inlet orifices 306 on the front of network computer 120. System fan 350, used to cool one or more multiprocessors in network server computer 120, located at about the midpoint of network computer system 120 and behind fanless power supply receptacles 300, 302, 304, draws air in through air inlet orifices 306, over and through fanless power supplies 150–154 (when those units are present, which typically are present in that most systems require at least two such units to operate effectively), and forces the air over multiprocessors (not shown) located behind fan 350 and out of network server computer 120 via air outlet orifices (not shown). Alternatively, the fans could drive the air in the opposite direction (i.e., back to front) because the designs of fanless power supplies 150, 152, 154 and their respectively paired fanless power supply receptacles 300, 302, 304 are essentially bi-directional, and can be cooled by air flow in either (back to front, or front to back) direction.

In addition to the foregoing, the above-depicted fanless power supplies in conjunction with the fanless power supply receptacles are particularly useful in a environments which have a strong need for "redundant" components (e.g., hot-swappable power supplies) which must be accessible to the user (i.e., they cannot be positioned in such a manner that the user cannot replace a failed component without shutting off the system and dissembling the unit). As another additional advantage, those skilled in the art will appreciate that the "top-insertion" of the power supplies shown as opposed to conventional "horizontal-insertion" (e.g., the insertion of conventional fan-containing power supplies from the back of a data processing system) gives increased airflow. There are several reasons for the increased airflow, but one arises from the placement (such placement being described below) of an electrical connector substantially out of the desired airflow path. As yet another additional advantage, the orientation of the power supply receptacles and the fanless power supplies are such that their air ingresses and egresses (e.g., their grid-works and grid-faces) are such that the air ingresses and/or egresses substantially minimize airflow obstruction. For example, the sides—containing grid-works—of the power supply receptacles, and the sides—containing grid-faces—of the fanless power supplies are shown as being positioned perpendicular to airflow, which has been found to provide substantially minimal airflow obstruction.

Figure 4:
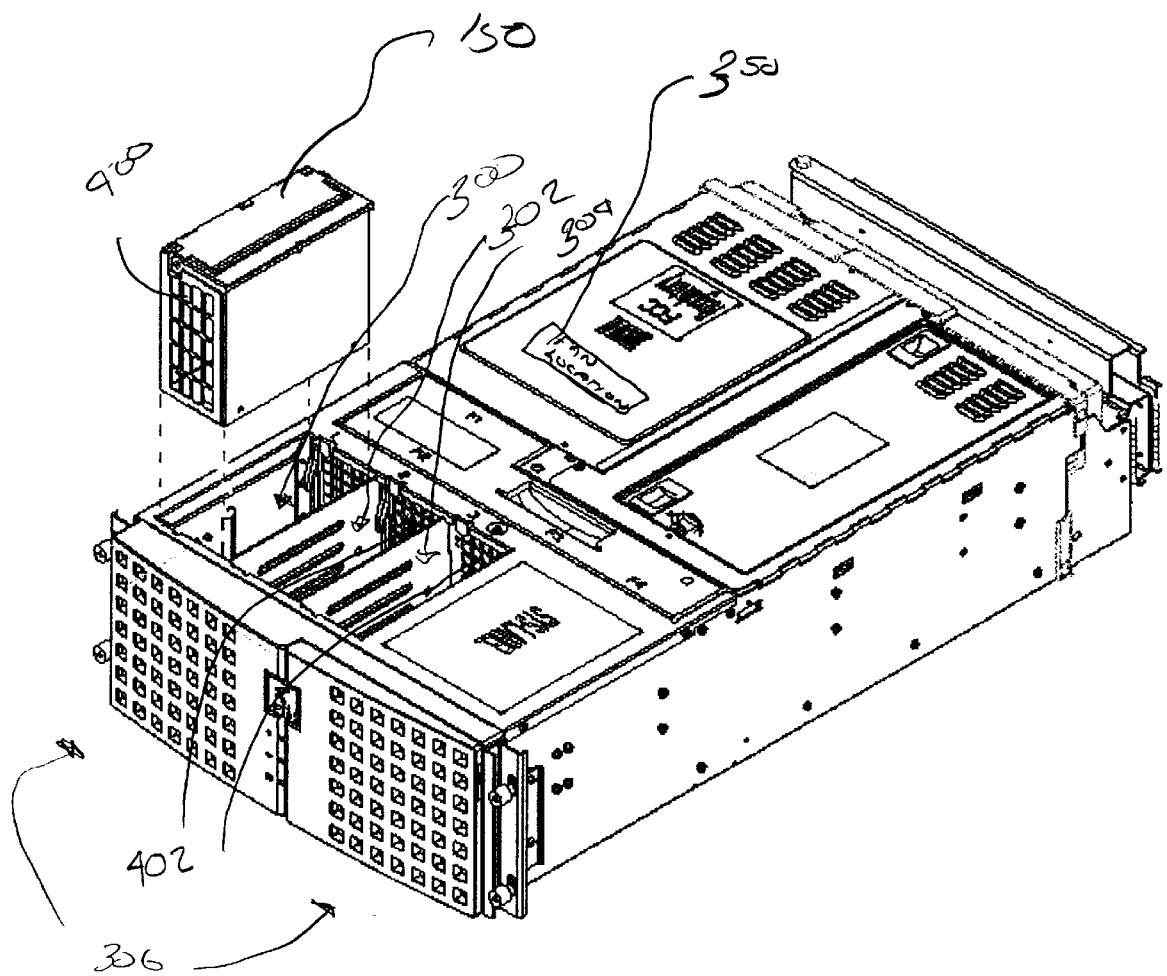
FIG. 4 shows a perspective view of fanless power supply 150 fully extracted from network server computer 120 and depicts fanless power supply receptacles 300, 302, 304.

With reference now to FIG. 4, shown is a perspective view of fanless power supply 150 fully extracted from network server computer 120. Depicted are fanless power supply receptacles 300, 302, 304. Notice that fanless power supply 150 has front grid-face 400, and a matching rear grid-face (not shown), both of substantially the same pattern as that shown in fanless power supply receptacle 300 which has rear grid-work 402, and a corresponding front grid-work (not shown). The grid-faces and grid-works are specially representative of more general air ingresses and air egresses, which are openings formed for the purpose of allowing cooling air flowthrough. Each fanless power supply 150, 152, 154 and each fanless power supply receptacle 300, 302, 304 is machined such that the corresponding grid-faces and grid-works "match up" such that near-optimum flow-through is achieved (e.g., the unobstructed regions front grid-face 400 of power supply 150 match up with the unobstructed regions front grid-work (not shown) of power supply receptacle 300, and the unobstructed regions of rear grid-face (not shown) of power supply 150 match up with the unobstructed regions of rear grid-work 402 of power supply receptacle 300).

Figure 5:
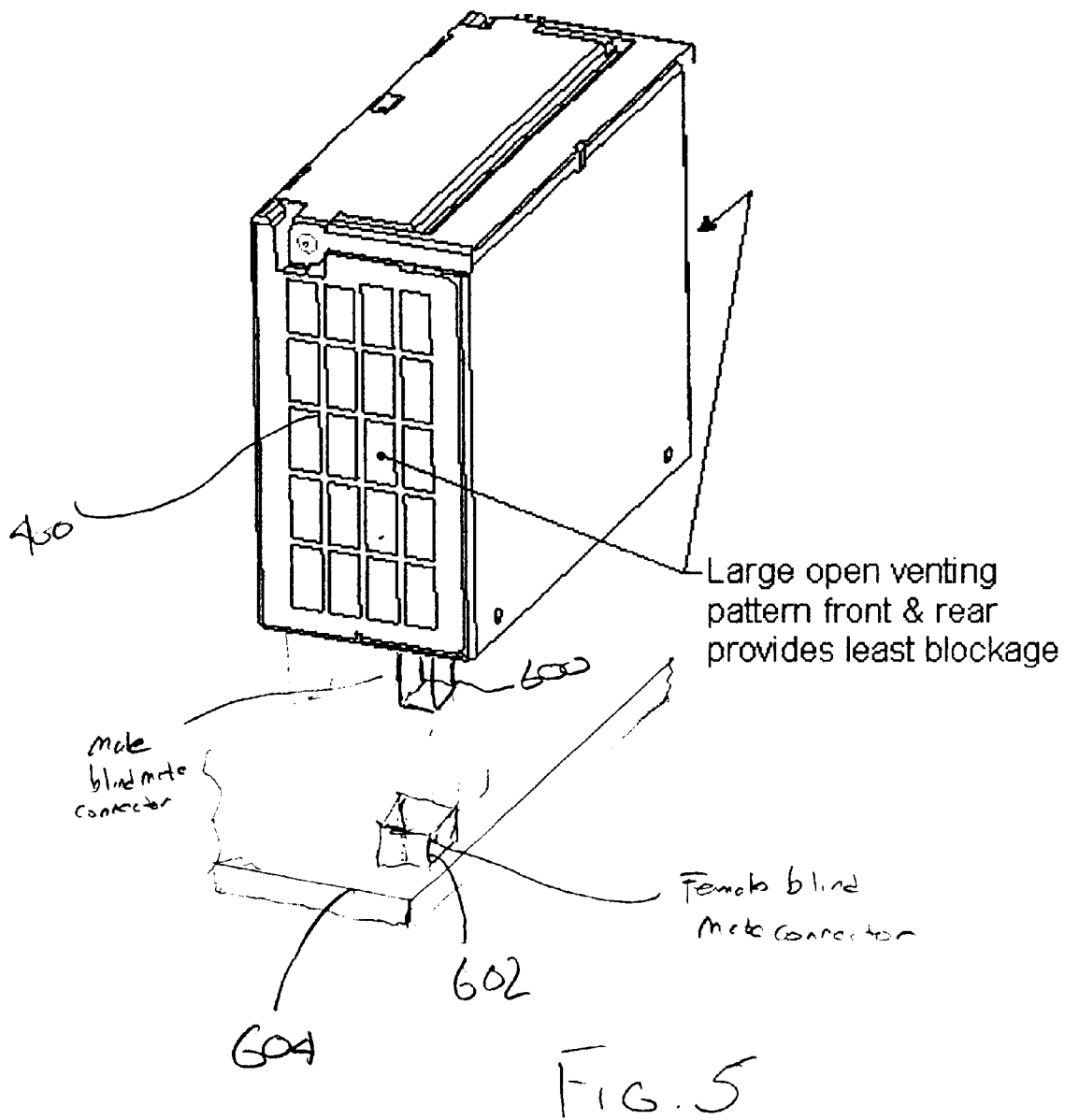
FIG. 5 shows an expanded detailed perspective view of fanless power supply 150.
Figure 1:
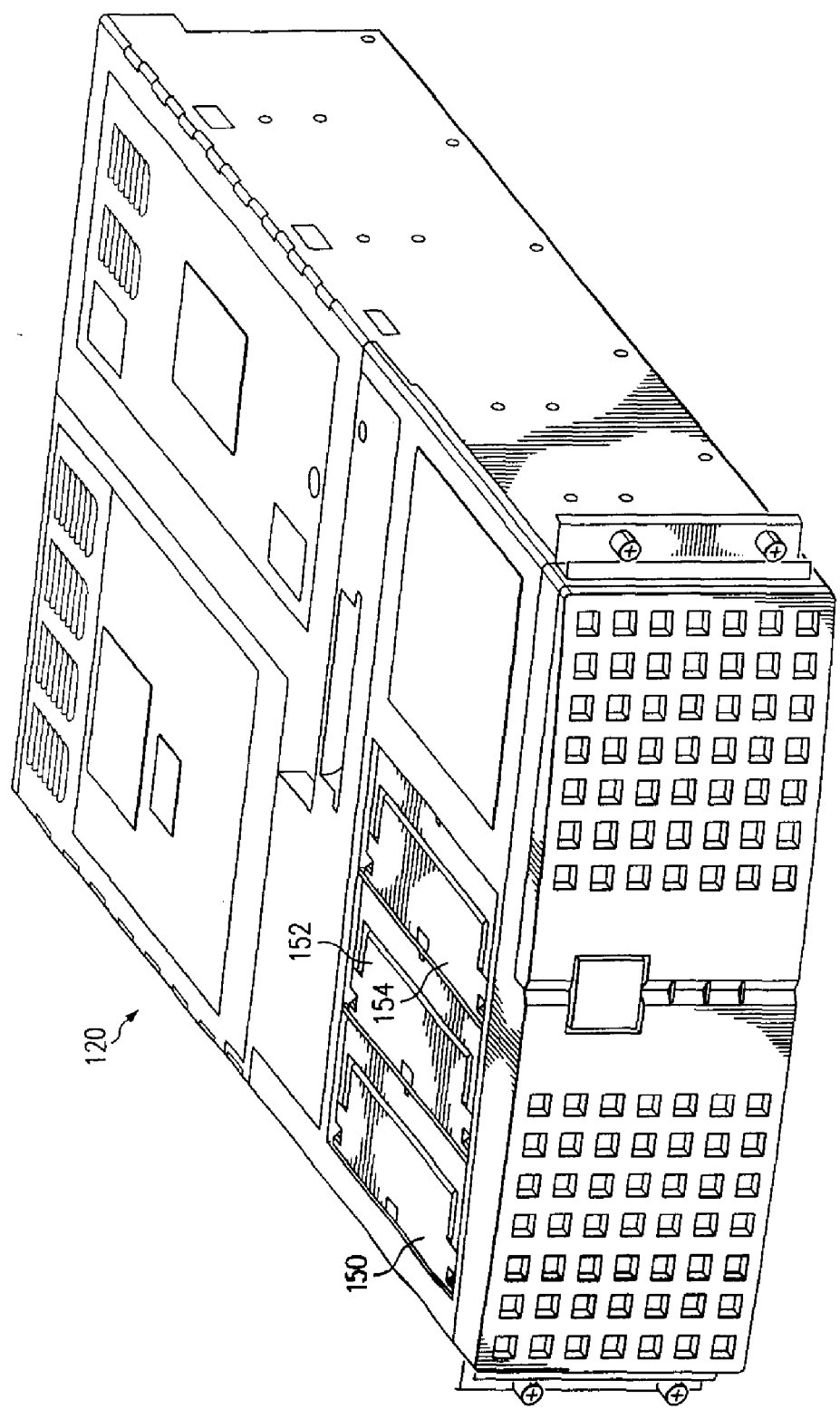
Figure 2:
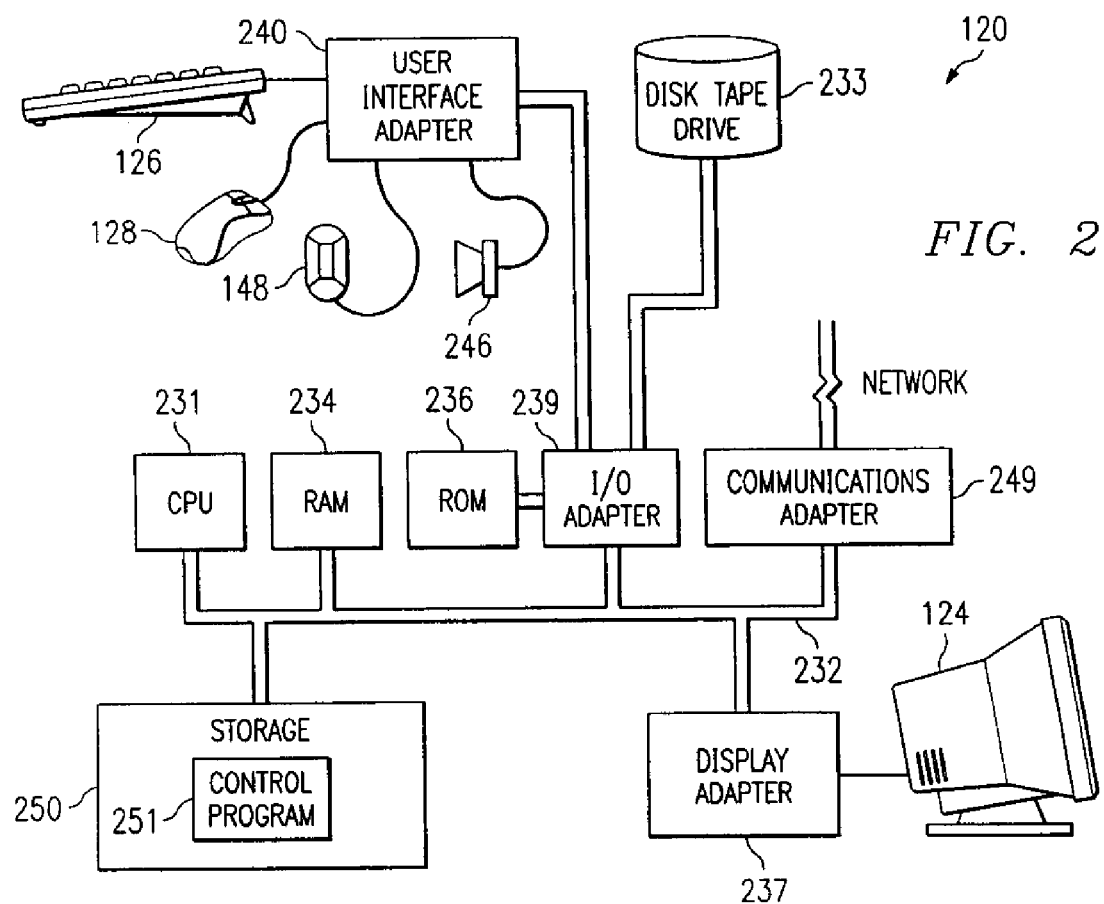
Figure 5:
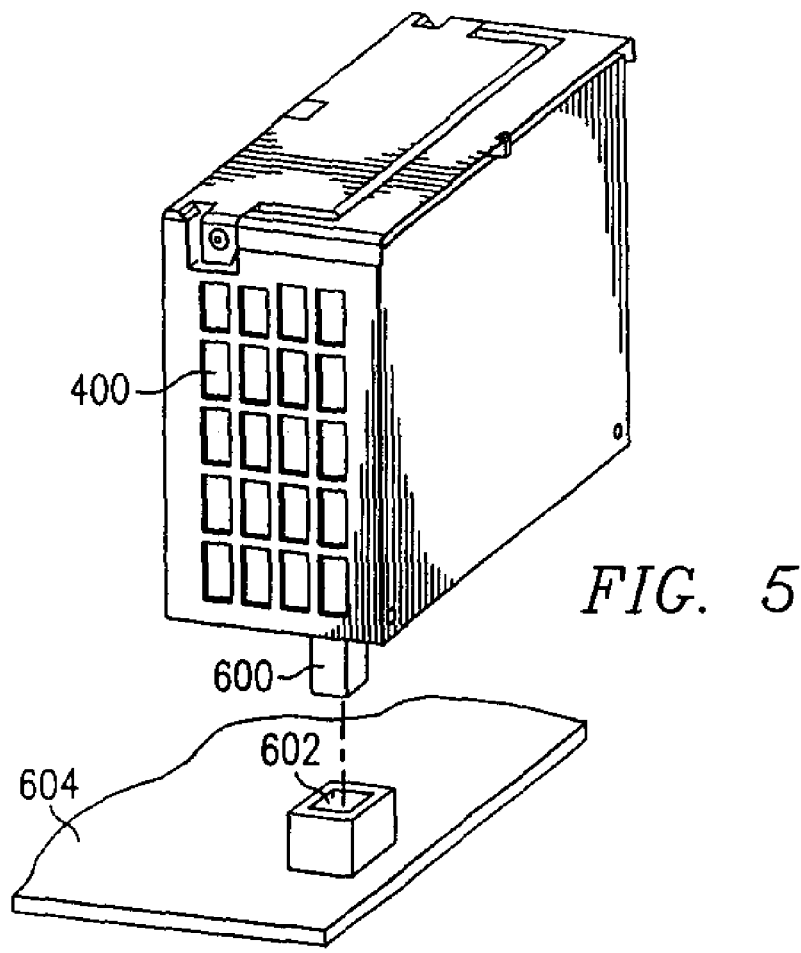

Referring now to FIG. 5, shown is an expanded detailed perspective view of exemplary fanless power supply 150. Depicted is an expanded view of front grid-face 400. Rear grid-face (not shown) is to be understood to be in substantially the same venting pattern as that shown for front grid-face 400. Illustrated on the bottom side of fanless power supply 150 is blind mating connection 600 which interfaces with its mate 602 affixed to a current sharing board 604 which is, in this design, situated at the bottom of fanless power supply receptacle 300. Those skilled in the art will appreciate that placing blind mating connection 600 on the bottom of fanless power supply 150 and placing current sharing board 604 into the bottom of fanless power supply receptacle 300 eliminates both the cabling and resultant dead air space that usually exists in the prior art scheme of connecting power supplies and allows the airflow to move through the unit without obstruction. However, it is to be understood that blind mating connection 600 is also to be illustrative of blind mating connections being located on a surface of a power supply which is substantially out of the path of airflow through the power supply, such that the positioning give rises to the foregoing described advantages.

While the foregoing has described the advantages of the positioning of the blind mate connectors such that they are out of the path of the desired airflow in the context of fanless power supplies, it is to be understood that such positioning would also have utility with conventional fan-containing power supplies. That is, by so placing a first blind mate connector on a surface of a fan-containing power supply and a second blind mate connector, which is to mate with an supply power through the first connector, within a data processing system such that no cabling or connector obstructs airflow through the power supply, the efficiency of the fan-containing power supply will be improved.

OTHER EMBODIMENT

Several various embodiments have been described above, and it will be obvious to those skilled in the art that, based upon the teachings herein, changes and modifications may be made without departing from this invention and its broader aspects. That is, all examples set forth herein are intended to be exemplary and non-limiting.

For example, while the foregoing described embodiments have been described in the context of a single processor for the sake of clarity, it will be understood by those within the art that the present invention could be used in multiple processor environments. Furthermore air orifices were shown in the front and rear of a network server computer. However, side air orifices are also envisioned within the spirit of the claimed invention. Furthermore, grid-works were shown on the front and rear of the fanless power supplies, but grid-works on the sides of the fanless power supplies are also envisioned within the spirit of the claimed invention. Accordingly, the described architectures are not intended to be limiting.

Other embodiments are within the following claims.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that if a specific number of an introduced claim element is intended, such an intent will be explicitly recited in the claim, and in the absence of such recitation no such limitation is present. For example, as an aid to understanding, the following appended claims may contain usage of the phrases "at least one" or "one or more," or the indefinite articles "a" or "an," to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use of definite articles used to introduce claim elements.

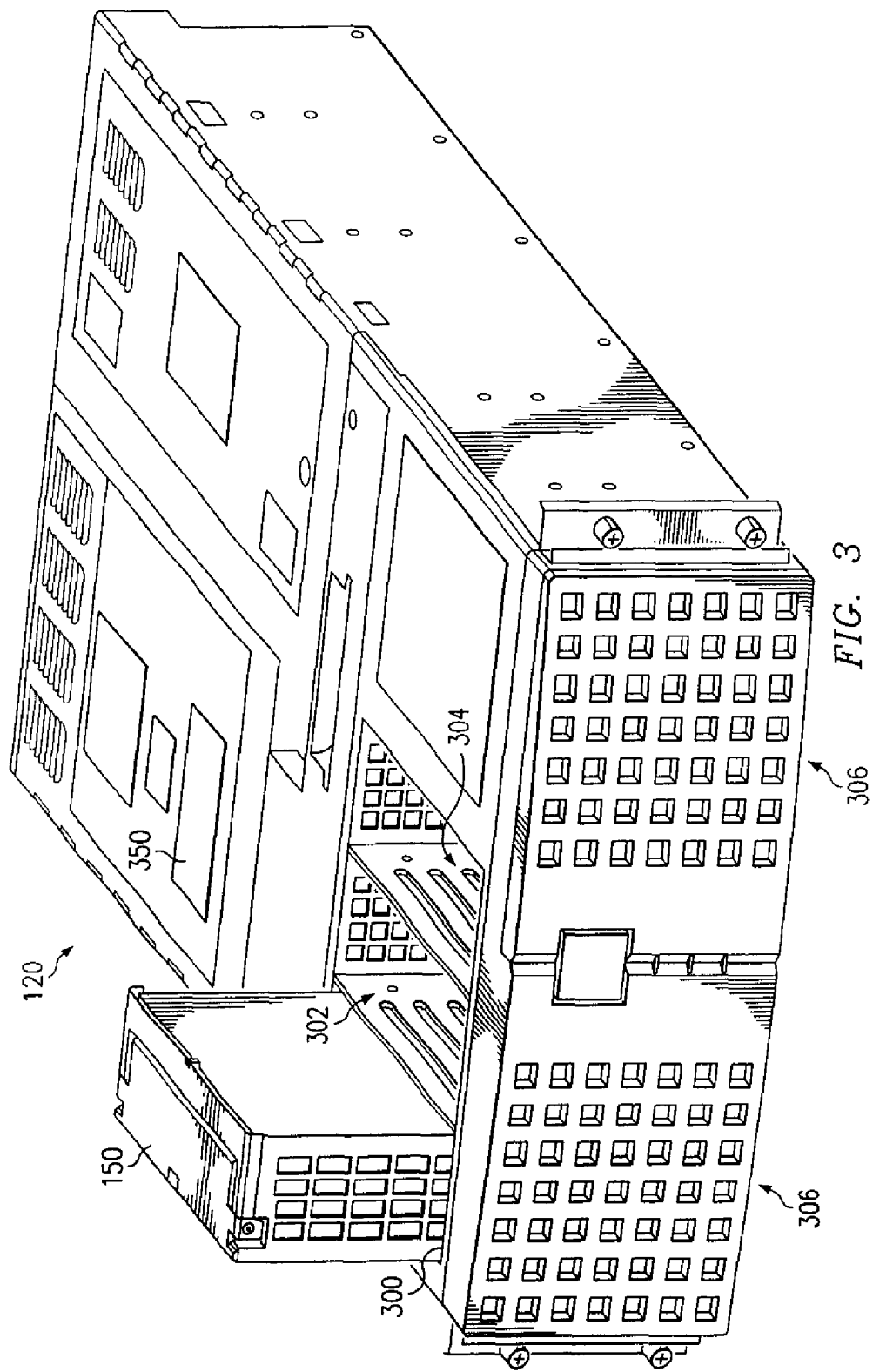

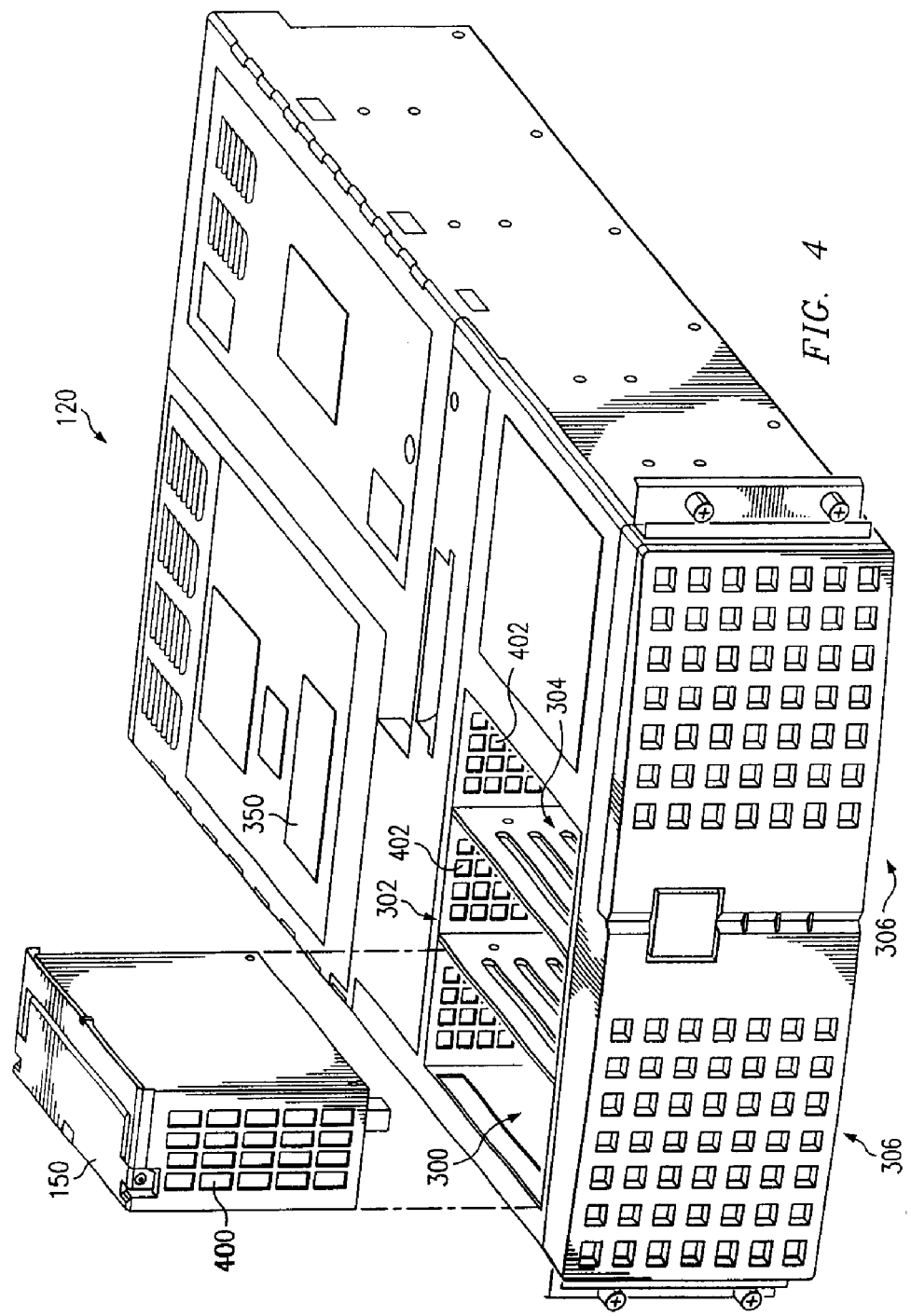

What is claimed is:

1. A computer system comprising:
   a system fan disposed in the computer system, the system fan operable to create an airflow path to dissipate heat within the computer system, the airflow path extending through the computer system, the airflow path operable to enter from a first side of the computer system and exit from a second side of the computer system such that the first side is opposite from the second side;

a fanless power supply disposed in the airflow path, the fanless Power supply operable to provide electrical power to the computer system;

the fanless power supply including at least one air ingress and at least one air egress;

both the at least one air ingress and the at least one air egress oriented to substantially minimize airflow obstruction such that the airflow path moves in a substantially direct path through the computer system; and a first electrical connector positioned on the fanless power supply such that the first electrical connector is outside the airflow path.

2. The computer system of claim 1, further comprising:
an operating system;
a processing unit; and
a system memory.

3. The computer system of claim 1, further comprising:
a network card; and
a hard drive.

4. A computer system comprising:

a system fan disposed in the computer system, the system fan operable to create an airflow path to dissipate heat within the computer system, the airflow path extending through the computer system, the airflow path operable to enter from a first side of the computer system and exit from a second side of the computer system such that the first side is opposite from the second side;

a fanless power supply disposed in the airflow path, the fanless power supply operable to provide electrical power to the computer system;

the fanless power supply including at least one air ingress and at least one air egress;

both the at least one air ingress and the at least one air egress oriented to substantially minimize airflow obstruction such that the airflow path moves in a substantially direct path through the computer system; and a first electrical connector positioned on the fanless power supply substantially parallel to the airflow path through the fanless power supply such that airflow obstruction by the first electrical connector is substantially minimized.

5. A computer system comprising:

a system fan disposed in the computer system, the system fan operable to create an airflow path to dissipate heat within the computer system, the airflow path extending through the computer system, the airflow path operable to enter from a first side of the computer system and exit from a second side of the computer system such that the first side is opposite from the second side;

a fanless power supply disposed in the airflow path, the fanless power supply operable to provide electrical power to the computer system;

the fanless power supply including at least one air ingress and at least one air egress;

both the at least one air ingress and the at least one air egress oriented to substantially minimize airflow obstruction such that the airflow path moves in a substantially direct path through the computer system;

the at least one air ingress including a grid-face on a first side of the fanless power supply, the grid-face being oriented substantially perpendicular to the airflow path;

the at least one air egress including a grid-face on a second side of the fanless power supply, the second side of the fanless power supply being oriented substantially parallel to the first side; and a power supply receptacle operable to receive the fanless power supply, the receptacle oriented in the computer system such that a portion of the established airflow path is directed through the receptacle even if the fanless power supply is not placed therein.

6. The computer system of claim 5, wherein the power supply receptacle includes a grid design disposed on a first wall of the receptacle and a second wall of the receptacle, the first wall operable to be placed adjacent the first side of the fanless power supply, the second wall operable to be placed adjacent the second side of the fanless power supply when the fanless power supply is placed therein.

7. The computer system of claim 6, wherein the grid design of the power supply receptacle matches the grid-face of fanless power supply such that airflow obstruction is substantially minimized.

8. The computer system of claim 4, wherein the power supply receptacle further includes a second electrical connector for mating with the first electrical connector on the fanless power supply.

9. The computer system of claim 8, wherein the second electrical connector comprises a circuit board.

10. A network server computer system, comprising:
a processing unit;
a computer case operable to house the network server computer system;

the computer case operably designed to provide an established airflow path for dissipating heat in the network server computer system;

a system fan disposed in the computer case operable to create an airflow through the airflow path, wherein the airflow path enters a first side of the system case and exits a second side of the system case such that the first side is opposite the second side;

a power supply receptacle forming part of the computer case, the receptacle forming a part of the airflow path such that the airflow enters a first side of the receptacle and exits a second side of the receptacle;

a fanless power supply disposed in the power supply receptacle, the fanless power supply operable to provide electrical power to the network server computer system, the fanless power supply including an air ingress, an air egress and a first power connector;

the fanless power supply being oriented in the receptacle such that the air ingress is adjacent the first side of the receptacle and the air egress is adjacent the second side of the receptacle to substantially minimize airflow obstruction; and the airflow path operable to dissipate heat from the fanless power supply.

11. The network server computer system of claim 10, wherein the power supply receptacle further comprises a second power connector operable to electrically couple to the first power connector on the fanless power supply, wherein the fanless power supply provides electrical power to the network server computer system via the first and second power connectors.

12. The network server computer system of claim 11, wherein the first and second power connectors comprise blind mate connectors operable to connect as the fanless power supply is disposed in the receptacle.

13. The network server computer system of claim 10, wherein the air ingress and the air egress further comprise a grid-like structure operable to provide minimal obstruction to the airflow path.

14. The network server computer system of claim 13, wherein the first side and second side of the power supply receptacle further comprise a grid pattern operable to provide minimal obstruction to the airflow path.

15. The network server computer system of claim 14, wherein the grid-like structure of the air ingress and the air egress of the fanless power supply is substantially similar to the grid pattern of the first and second side of the receptacle;
   whereby the airflow path is minimally obstructed as the grid-like structure and the grid pattern are placed adjacent to each other.

16. A method of dissipating heat in a fanless power supply, comprising;
   providing a computer system including an operating system, a processing unit, and a system memory;
   installing the computer system in a computer case, the computer case designed to provide an air flow path entering a front portion of the computer case and exiting a rear portion of the computer case;
   cooling the computer system with a system fan, the system fan operable to create the air flow path to traverse therethrough;
   placing a fanless power supply in the computer system, the power supply being oriented in a direction to allow the air flow path to enter the power supply via an air ingress and exit the power supply via an air egress, wherein the air flow path remains substantially unaltered as it traverse through the power supply;
   removing the heat generated by the power supply as the air flow pass therethrough; and
   forming at least one power supply receptacle in the computer case, the receptacle operable to orient the fanless power supply in a proper direction for allowing the airflow path to traverse therethrough.

17. The method of claim 16, further comprising:
   forming a front side air ingress panel in a computer case, the computer case operable to provide a housing for the computer system; and
   forming a rear side air egress panel in a computer case;
   whereby the airflow path enters the computer case via the front side air ingress panel and leaves the computer case via the rear side air egress panel.

18. The method of claim 17, wherein the front side air ingress and the rear side air egress include a grid-like structure to allow the airflow to pass therethrough.

19. The method of claim 16, wherein the at least one power supply receptacle includes a grid-pattern formed over the airflow path.

20. The method of claim 19, further comprising:
   aligning the fanless power supply air ingress with the grid pattern on the receptacle; and
   aligning the fanless power supply air egress with the grid patter of the receptacle such that the airflow path traverse through the power supply with substantial minimal obstructions.

21. A method of dissipating heat in a fanless power supply, comprising:
   providing a computer system including an operating system, a processing unit, and a system memory;
   installing the computer system in a computer case, the computer case designed to provide an airflow path entering a front portion of the computer case and exiting a rear portion of the computer case;
   cooling the computer system with a system fan, the system fan operable to create the airflow path to traverse therethrough;
   placing a fanless power supply in the computer system, the power supply being oriented in a direction to allow the airflow path to enter the power supply via an air ingress and exit the power supply via an air egress, wherein the airflow path remains substantially unaltered as it traverse through the power supply;
   removing the heat generated by the power supply as the airflow pass therethrough; and
   locating a power connection associated with the fanless power supply substantially outside of the airflow path.

22. A method of dissipating heat in a fanless power supply, comprising:
   providing a computer system including an operating system, a processing unit, and a system memory;
   installing the computer system in a computer case, the computer case designed to provide an airflow path entering a front portion of the computer case and exiting a rear portion of the computer case;
   cooling the computer system with a system fan, the system fan operable to create the airflow path to traverse therethrough;
   placing a fanless power supply in the computer system, the power supply being oriented in a direction to allow the airflow path to enter the power supply via an air ingress and exit the power supply via an air egress. wherein the airflow path remains substantially unaltered as it traverse through the power supply;
   removing the heat generated by the power supply as the airflow pass therethrough; and
   locating a power connection associated with the fanless power supply substantially perpendicular to the airflow path such that any airflow obstruction is minimized such that the power connection is operable to electrically couple the fanless power supply to the computer system.

23. The computer system of claim 1, wherein the at least one air ingress comprises a grid-face on a first side of the fanless power supply, the grid-face being oriented substantially perpendicular to the airflow path.

24. The computer system of claim 23, wherein the at least one air egress comprises a grid-face on a second side of the fanless power supply, the second side of the fanless power supply being oriented substantially parallel to the first side.

25. The computer system of claim 24, further comprising a power supply receptacle operable to receive the fanless power supply, the receptacle oriented in the computer system such that a portion of the established airflow path is directed through the receptacle even if the fanless power supply is not placed therein.

26. The computer system of claim 25, wherein the power supply receptacle includes a grid design disposed on a first wall of the receptacle and a second wall of the receptacle, the first wall operable to be placed adjacent the first side of the fanless power supply, the second wall operable to be placed adjacent the second side of the fanless power supply when the fanless power supply is placed therein.

27. The computer system of claim 26, wherein the grid design of the power supply receptacle matches the grid-face of fanless power supply such that airflow obstruction is substantially minimized.

28. The computer system of claim 4, further comprising:

an operating system;

a processing unit; and a system memory.

29. The computer system of claim 4, further comprising:

a network card; and a hard drive.

30. The computer system of claim 4, wherein the at least one air ingress comprises a grid-face on a first side of the fanless power supply, the grid-face being oriented substantially perpendicular to the airflow path.

31. The computer system of claim 30, wherein the at least one air egress comprises a grid-face on a second side of the fanless power supply, the second side of the fanless power supply being oriented substantially parallel to the first side.

32. The computer system of claim 31, further comprising a power supply receptacle operable to receive the fanless power supply, the receptacle oriented in the computer system such that a portion of the established airflow path is directed through the receptacle even if the fanless power supply is not placed therein.

33. The computer system of claim 32, wherein the power supply receptacle includes a grid design disposed on a first wall of the receptacle and a second wall of the receptacle, the first wall operable to be placed adjacent the first side of the fanless power supply, the second wall operable to be placed adjacent the second side of the fanless power supply when the fanless power supply is placed therein.

34. The computer system of claim 33, wherein the grid design of the power supply receptacle matches the grid-face of fanless power supply such that airflow obstruction is substantially minimized.

35. The computer system of claim 5, further comprising:

an operating system;

a processing unit; and a system memory.

36. The computer system of claim 5, further comprising:

a network card; and a hard drive.

37. The method of claim 21, further comprising:

forming a front side air ingress panel in a computer case, the computer case operable to provide a housing for the computer system; and forming a rear side air egress panel in a computer case;

whereby the airflow path enters the computer case via the front side air ingress panel and leaves the computer case via the rear side air egress panel.

38. The method of claim 37, wherein the front side air ingress and the rear side air egress include a grid-like structure to allow the airflow to pass therethrough.

39. The method of claim 22, further comprising:

forming a front side air ingress panel in a computer case, the computer case operable to provide a housing for the computer system; and forming a rear side air egress panel in a computer case;

whereby the airflow path enters the computer case via the front side air ingress panel and leaves the computer case via the rear side air egress panel.

40. The method of claim 39, wherein the front side air ingress and the rear side air egress include a grid-like structure to allow the airflow to pass therethrough.

* * * * *

UNITED STATES PATENT AND TRADEMARK OFFICE
CERTIFICATE OF CORRECTION

PATENT NO. : 6,650,535 B1
DATED : November 18, 2003
INVENTOR(S) : David L. Moss et al.

It is certified that error appears in the above-identified patent and that said Letters Patent is hereby corrected as shown below:

Title page,
Delete the title page and substitute therefor the attached title page.

Drawings,
Delete the Drawing Sheets 1-5 and substitute therefor the attached Drawing Sheets 1-5.

Signed and Sealed this

Nineteenth Day of April, 2005

JON W. DUDAS
*Director of the United States Patent and Trademark Office*

(12) United States Patent
Moss et al.

(10) Patent No.: US 6,650,535 B1
(45) Date of Patent: Nov. 18, 2003

(54) FANLESS POWER SUPPLY

(75) Inventors: David L. Moss, Austin, TX (US); Robert G. Bassman, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 09/360,467

(22) Filed: Jul. 23, 1999

(51) Int. Cl.⁷ ................................................. G06F 1/16
(52) U.S. Cl. .................... 361/687; 361/695; 454/184; 312/223.1
(58) Field of Search ........................... 361/683, 687, 361/686, 689, 692, 695, 690, 694; 312/223.1, 223.2; 364/708.1; 174/16.1; 220/4.02, 4.28; 248/632; 218/105, 106, 109; 307/50; G06F 1/16

(56) References Cited

U.S. PATENT DOCUMENTS

| | | | |
|---|---|---|---|
| 4,126,269 A | * 11/1978 | Bruges | 236/49 |
| 4,728,160 A | * 3/1988 | Mondor et al. | 312/236 |
| 4,982,120 A | 1/1991 | Longwell et al. | 307/572 |
| 5,099,391 A | * 3/1992 | Maggelet et al. | 361/395 |
| 5,119,270 A | * 6/1992 | Bolton et al. | 361/384 |
| 5,168,424 A | * 12/1992 | Bolton et al. | 361/384 |
| 5,193,050 A | * 3/1993 | Dimmick et al. | 361/384 |
| 5,218,514 A | * 6/1993 | Huynh et al. | 361/384 |
| 5,237,484 A | * 8/1993 | Ferchau et al. | 361/689 |
| 5,243,493 A | 9/1993 | Jeng et al. | 361/690 |
| 5,408,669 A | 4/1995 | Stewart et al. | 395/750 |
| 5,530,636 A | 6/1996 | Brown | 363/97 |
| 5,596,483 A | * 1/1997 | Wyler | 361/683 |
| 5,715,465 A | 2/1998 | Savage et al. | 395/750 |
| 5,737,189 A | * 4/1998 | Kammersgard et al. | 361/726 |
| 5,793,610 A | * 8/1998 | Schmitt et al. | 361/695 |
| 5,898,572 A | 4/1999 | Shennib et al. | 361/713 |
| 5,909,357 A | * 6/1999 | Orr | 361/687 |
| 5,940,288 A | * 8/1999 | Kociecki | 363/144 |
| 6,011,689 A | * 1/2000 | Wrycraft | 361/695 |
| 6,115,250 A | * 9/2000 | Schmitt | 361/695 |

OTHER PUBLICATIONS

Article "Thermally Optimized System Layout for Computers", IBM Technical Disclosure Bulletin. Mar. 1991, US, vol. 33, Issue 10A, pp. 51–53.*

(List continued on next page.)

*Primary Examiner*—Michael Datskovsky
(74) *Attorney, Agent, or Firm*—Baker Botts L.L.P.

(57) ABSTRACT

A method and system for use with data processing systems. The method includes forming a fanless power supply having at least one air ingress and at least one air egress. The method further includes forming a fanless power supply receptacle having at least one air ingress and at least one air egress. The system includes forming a fanless power supply having at least one air ingress and at least one air egress. The system further includes forming a fanless power supply receptacle having at least one air ingress and at least one air egress.

40 Claims, 5 Drawing Sheets

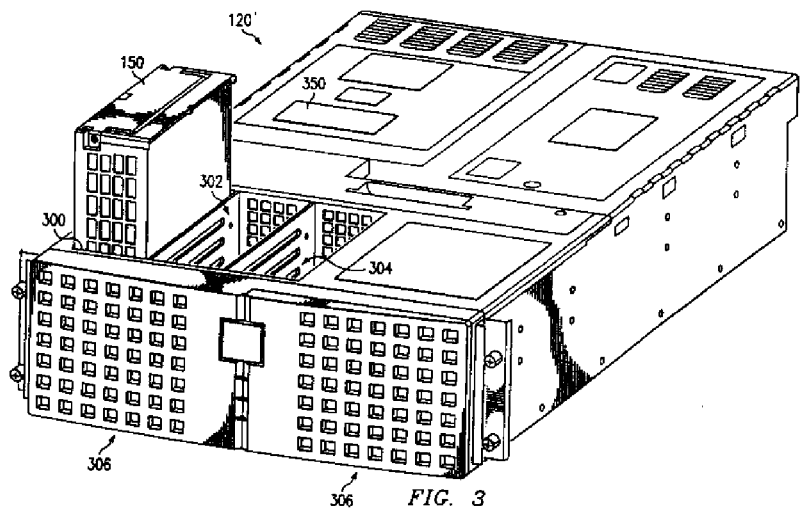

FIG. 3